(12) United States Patent
Kim et al.

(10) Patent No.: US 7,903,499 B2
(45) Date of Patent: Mar. 8, 2011

(54) INTEGRATED CIRCUIT MEMORY DEVICES INCLUDING DELAYED CLOCK INPUTS FOR INPUT/OUTPUT BUFFERS AND RELATED SYSTEMS AND METHODS

(75) Inventors: JinGook Kim, Gyeonggi-do (KR); Kwangil Park, Gyeonggi-do (KR); Seungjun Bae, Daegu (KR); Sihong Kim, Gyeonggi-do (KR); Jaehyung Lee, Gyeonggi-do (KR); Daehyun Chung, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 110 days.

(21) Appl. No.: 12/255,090

(22) Filed: Oct. 21, 2008

(65) Prior Publication Data
US 2009/0154256 A1    Jun. 18, 2009

(30) Foreign Application Priority Data
Oct. 24, 2007  (KR) .................. 10-2007-0106953

(51) Int. Cl.
*G11C 8/00* (2006.01)
*G11C 7/10* (2006.01)
(52) U.S. Cl. .......... 365/233.1; 365/189.05; 365/191; 365/194
(58) Field of Classification Search .......... 365/191, 365/189.05, 233.1
See application file for complete search history.

(56) References Cited

U.S. PATENT DOCUMENTS

| | | | |
|---|---|---|---|
| 4,242,741 A | 12/1980 | Parrish | |
| 6,003,118 A * | 12/1999 | Chen | .............. 711/167 |
| 6,078,514 A * | 6/2000 | Takemae et al. | ............ 365/63 |
| 6,201,442 B1 | 3/2001 | James et al. | |
| 6,327,217 B1 | 12/2001 | Chung | |

(Continued)

FOREIGN PATENT DOCUMENTS
JP    H8-287199    11/1996
(Continued)

OTHER PUBLICATIONS

JEDEC Standard, DDR2 SDRAM Specification, JESD79-2B, Revision of JESD79-2A, JEDEC Solid State Technology Association, Jan. 2005, pp. 1-103.

(Continued)

*Primary Examiner* — Ly D Pham
(74) *Attorney, Agent, or Firm* — Myers Bigel Sibley & Sajovec, P.A.

(57) ABSTRACT

A memory system may include an integrated circuit memory device and a memory controller coupled to the integrated circuit memory device. The integrated circuit memory device may include a memory cell array having a plurality of memory cells, a clock generator configured to generate a clock signal, a plurality of data input/output buffers, and a delay circuit. The plurality of data input/output buffers may be coupled between respective data input/output pads and the memory cell array, and each of the data input/output buffers may be configured to communicate data with the memory cell array responsive to the clock signal with the clock signal being applied to a clock input of each of the input/output buffers. The delay circuit may be coupled between the clock generator and a first one of the data input/output buffers so that the clock signal is delayed by different amounts at clock inputs of the first data input/output buffer and a second one of the data input/output buffers. Moreover, the memory controller may be configured to perform data training. Related methods and memory devices are also discussed.

20 Claims, 11 Drawing Sheets

U.S. PATENT DOCUMENTS

| | | | |
|---|---|---|---|
| 6,411,161 B1 | 6/2002 | Yamamoto | |
| 6,728,162 B2 | 4/2004 | Lee et al. | |
| 6,909,643 B2 | 6/2005 | Kwean | |
| 7,391,255 B2* | 6/2008 | Matsuzaki | 327/565 |
| 7,778,097 B2 | 8/2010 | Chung et al. | |
| 2002/0001360 A1* | 1/2002 | Park et al. | 375/372 |
| 2002/0093871 A1* | 7/2002 | Kwak | 365/233 |
| 2002/0174373 A1* | 11/2002 | Chang | 713/401 |
| 2003/0128597 A1* | 7/2003 | Jun et al. | 365/194 |
| 2005/0240718 A1 | 10/2005 | Chung et al. | |
| 2007/0002644 A1 | 1/2007 | Kang | |
| 2007/0146375 A1* | 6/2007 | Kang | 345/531 |
| 2008/0089167 A1* | 4/2008 | Dono | 365/233.5 |
| 2009/0100285 A1* | 4/2009 | Bae et al. | 713/400 |

FOREIGN PATENT DOCUMENTS

| | | |
|---|---|---|
| JP | 2002-352583 | 12/2002 |
| KR | 10-1999-0049424 | 7/1999 |
| KR | 2000-0009138 | 2/2000 |
| KR | 2000-009138 | 2/2000 |
| KR | 1020020086197 A | 11/2002 |
| KR | 1020040095916 A | 11/2004 |
| KR | 1020070002803 A | 1/2007 |

OTHER PUBLICATIONS

Preliminary publication of JEDEC Semiconductor Memory Standard, GDDR4 SGRAM Specification, Feb. 2006, pp. 4-76.

Menolfi et al. "A 16Gb/s Source-Series Terminated Transmitter in 65nm SOI" IBM Research GmbH, Zurich Research Laboratory, Ruschlikon, Switzerland, IEEE International Solid-State Circuits Conference, 2007.

* cited by examiner

INTEGRATED CIRCUIT MEMORY DEVICES INCLUDING DELAYED CLOCK INPUTS FOR INPUT/OUTPUT BUFFERS AND RELATED SYSTEMS AND METHODS

RELATED APPLICATIONS

This U.S. non-provisional patent application claims the benefit of priority under 35 U.S.C. §119 of Korean Patent Application No. 10-2007-0106953, filed on Oct. 24, 2007, the disclosure of which is hereby incorporated herein by reference in its entirety.

FIELD OF THE INVENTION

The present invention generally relates to electronics, and more particularly, to electronic memory devices and related systems and methods.

BACKGROUND

When transmitting a plurality of data bits in parallel over a respective plurality of parallel transmission lines, differences in transmission line length and/or other transmission line characteristics may cause the plurality of data bits to be received at different times. Stated in other words, different ones of the parallel transmission lines may have different transmission line delays. Accordingly, data training may be used to tune a timing of transmission of the plurality of data bits to compensate for the different transmission line delays so that reception of the plurality of data bits may be improved. More particularly, a phase (or delay) of data transmission over each of the parallel transmission lines may be tuned relative to a clock signal to compensate for different transmission line delays.

By way of example, data input/output pads of a memory controller and an associated integrated circuit (IC) memory device may be electrically coupled using respective data input/output lines (also referred to as data input/output transmission lines). During a data training operation, a plurality of data training write operations are performed using known data transmitted from the memory controller in parallel over the parallel data input/output transmission lines at a plurality of different transmission phases (or transmission delays/advances). After each of the data training write operations, a determination is made for each of the data bits transmitted in parallel over each of the parallel input/output transmission lines whether the write operation for each data bit was a pass or a fail at the integrated circuit memory device, and a transmission phase (or delay) relative to the clock is selected for each data input/output transmission line resulting in a successful (i.e., a passing) data training write operation.

If multiple transmission phases (or delays) result in successful (i.e., passing) data training write operations over a same data input/output transmission line, a middle of the phases (or delays) resulting in successful (i.e., passing) data training write operations may be selected. Stated in other words, if more that two phases (or delays) result in successful (i.e., passing) data training write operations for a data input/output transmission line, an intermediate (or center) one of the successful (or passing) phases may be selected for that data input/output transmission line for subsequent write operations. Accordingly, neither the least nor the greatest phase/delay resulting in a successful data training write operation is selected if a plurality of phases/delays result in successful data training write operations.

SUMMARY

According to some embodiments of the present invention, a memory system may include an integrated circuit (IC) memory device and a memory controller coupled to the integrated circuit memory device. The integrated circuit memory device may include a memory cell array including a plurality of memory cells, a clock generator configured to generate a clock signal, a plurality of input/output buffers, and a delay circuit. The plurality of data input/output buffers may be coupled between respective data input/output pads and the memory cell array, and each of the data input/output buffers may be configured to communicate data with the memory cell array responsive to the clock signal with the clock signal being applied to a clock input of each of the input/output buffers. The delay circuit may be coupled between the clock generator and a first one of the data input/output buffers so that the clock signal is delayed by different amounts at clock inputs of the first data input/output buffer and a second one of the data input/output buffers. In addition, the memory controller may be configured to perform data training. Moreover, a difference in phase of the clock signal received at the first and second data input/output buffers may be greater than 180 degrees.

The plurality of data input/output buffers may include respective input buffers configured to write data received from the memory controller to the memory cell array responsive to the clock signals received at the clock inputs of the respective input/output buffers during write operations. The plurality of input buffers may be configured to receive a respective plurality of data bits in parallel during a same write operation responsive to a same edge of the clock signal. The memory controller may be configured to perform write data training to selectively delay data transmission to the input buffers so that reception of the data at the input buffers is aligned with the clock signals received at each input/output buffer during write operations.

The plurality of data input/output buffers may include respective output buffers configured to transmit data read from the memory cell array to the memory controller responsive to the clock signals received at the clock inputs of the respective input/output buffers during read operations. The plurality of output buffers may be configured to transmit a respective plurality of data bits in parallel during a same read operation responsive to a same edge of the clock signal. The memory controller may be configured to perform read data training to selectively delay data reception at the memory controller from the input buffers.

The delay circuit may include a variable delay circuit, and the variable delay circuit may be configured to provide one of a plurality of time delays for the clock signal responsive to an input signal provided thereto. The integrated circuit memory device may further include a delay controller coupled to the variable delay circuit, and the delay controller may be configured to select a delay to be provided by the variable delay circuit. The delay controller may be configured to select a delay responsive to instructions received from the memory controller. More particularly, the delay controller may be configured to select a delay responsive to a Mode Register Set (MRS) instruction received from the memory controller during a MRS operation. The delay circuit may include first and second delay circuits between the clock generator and the first and second data input/output buffers, respectively, so that the first and second delay circuits delay the clock signal by different amounts.

According to other embodiments of the present invention, a memory system may include an integrated circuit memory device with a memory cell array having a plurality of memory cells and a plurality of data input/output buffers coupled between respective data input/output pads and the memory cell array. The memory system may also include a memory controller coupled to the plurality of input/output buffers. A method of operating such a memory system may include generating a clock signal, and providing a delay so that the clock signal is delayed by different amounts at clock inputs of at least first and second ones of the data input/output buffers. Data may be communicated between the plurality of data input/output buffers and the memory cell array responsive to the clock signal received at the respective clock inputs of the input/output buffers. In addition, data training may be performed between the memory controller and the plurality of data input/output buffers. More particularly, a difference in phase of the clock signal received at the first and second data input/output buffers may be greater than 180 degrees.

The plurality of data input/output buffers may include respective input buffers, and communicating data between the plurality of data input/output buffers and the memory cell array may include writing data received from the memory controller to the memory cell array responsive to the clock signal received at the respective clock inputs of the respective input/output buffers during write operations. Writing data may include receiving a respective plurality of data bits in parallel at the data input buffers during a same write operation responsive to a same edge of the clock signal. Performing data training may include performing write data training to selectively delay data transmission to the input buffers so that reception of the data at the input buffers is aligned with the clock signal received at each input/output buffer during write operations.

The plurality of data input/output buffers may include respective output buffers, and communicating data between the plurality of data input/output buffers and the memory cell array may include transmitting data read from the memory cell array to the memory controller responsive to the clock signal received at the clock inputs of the respective input/output buffers during read operations. Transmitting data read from the memory cell array may include transmitting a respective plurality of data bits in parallel from the output buffers during a same read operation responsive to a same edge of the clock signal. Performing data training may include performing read data training to selectively delay data reception at the memory controller from the input buffers.

Providing the delay may include selecting one of a plurality of delays responsive to instructions provided by the memory controller. More particularly, providing the delay may include selecting one of a plurality of delays responsive to a Mode Register Set (MRS) instruction provided by the memory controller during a MRS operation.

According to still other embodiments of the present invention, an integrated circuit memory device may include a memory cell array having a plurality of memory cells, a clock generator configured to generate a clock signal, a plurality of data input/output buffers, and a delay circuit. The plurality of data input/output buffers may be coupled between respective data input/output pads and the memory cell array, and each of the data input/output buffers may be configured to communicate data with the memory cell array responsive to the clock signal with the clock signal being applied to a clock input of each of the input/output buffers. The delay circuit may be coupled between the clock generator and a first one of the data input/output buffers so that the clock signal is delayed by different amounts at clock inputs of the first data input/output buffer and a second one of the data input/output buffers. More particularly, a difference in phase of the clock signal received at the first and second data input/output buffers may be greater than 180 degrees.

The plurality of data input/output buffers may include respective input buffers configured to write data received from a memory controller to the memory cell array responsive to the clock signals received at the clock inputs of the respective input/output buffers during write operations. The plurality of input buffers may be configured to receive a respective plurality of data bits in parallel during a same write operation responsive to a same edge of the clock signal.

The plurality of data input/output buffers may include respective output buffers configured to transmit data read from the memory cell array to a memory controller responsive to the clock signals received at the clock inputs of the respective input/output buffers during read operations. The plurality of output buffers may be configured to transmit a respective plurality of data bits in parallel during a same read operation responsive to a same edge of the clock signal.

The delay circuit may include a variable delay circuit, and the variable delay circuit may be configured to provide one of a plurality of time delays for the clock signal responsive to an input signal provided thereto. The integrated circuit memory device may also include a delay controller coupled to the variable delay circuit with the delay controller being configured to select a delay to be provided by the variable delay circuit. The delay circuit may include first and second delay circuits between the clock generator and the first and second data input/output buffers, respectively, so that the first and second delay circuits delay the clock signal by different amounts.

According to yet other embodiments of the present invention, an integrated circuit memory device may include a memory cell array having a plurality of memory cells, a clock generator configured to generate a clock signal, a plurality of data input/output buffers, a plurality of variable delay circuits, and a delay controller. The plurality of data input/output buffers may be coupled between respective data input/output pads and the memory cell array, and each of the data input/output buffers may be configured to communicate data between a memory controller and the memory cell array responsive to the clock signal with the clock signal being applied to a clock input of each of the input buffers. Each variable delay circuit may be coupled between the clock signal generator and a respective one of the data input/output buffers, and each of the variable delay circuits may be configured to provide one of a plurality of different time delays for the clock signal. The delay controller may be coupled to each of the variable delay circuits with the delay controller being configured to select a respective delay to be provided by each of the variable delay circuits.

The delay controller may be configured to select delays to be provided by each of the variable delay circuits responsive to instructions received from the memoir controller outside the integrated circuit memory device. The delay controller may be configured to select delays to be provided by each of the variable delay circuits responsive to a Mode Register Set (MRS) instruction received from the memory controller during an MRS operation. The delay controller may be configured to select a first delay to be provided by one of the variable delay circuits during a first period and to select a second delay to be provided by the one of the variable delay circuits during a second period wherein the first and second delays are different.

The plurality of data input/output buffers may include respective input buffers configured to write data received from a memory controller to the memory cell array responsive to the clock signals received at the clock inputs of the respective input/output buffers during write operations. The plurality of input buffers may be configured to receive a respective plurality of data bits in parallel during a same write operation responsive to a same edge of the clock signal.

The plurality of data input/output buffers may include respective output buffers configured to transmit data read from the memory cell array to a memory controller responsive to the clock signals received at the clock inputs of the respective input/output buffers during read operations. The plurality of output buffers may be configured to transmit a respective plurality of data bits in parallel during a same read operation responsive to a same edge of the clock signal.

According to more embodiments of the present invention, a memory system may include an integrated circuit memory device and a memory controller coupled to the integrated circuit memory device. The integrated circuit memory device may include a memory cell array having a plurality of memory cells, a clock generator configured to generate a clock signal, a plurality of data input/output buffers, a plurality of variable delay circuits, and a delay controller. The plurality of data input/output buffers may be coupled between respective data input/output pads and the memory cell array, and each of the data input/output buffers may be configured to communicate data between a memory controller and the memory cell array responsive to the clock signal with the clock signal being applied to a clock input of each of the input buffers. Each variable delay circuit may be coupled between the clock signal generator and a respective one of the data input/output buffers with each of the variable delay circuits being configured to provide one of a plurality of different time delays for the clock signal. The delay controller may be coupled to each of the variable delay circuits with the delay controller being configured to select a respective delay to be provided by each of the variable delay circuits. The memory controller may be configured to transmit data to the plurality of input/output pads during write operations and to receive data from the plurality or input/output pads during read operations.

The memory controller may also be configured to perform data training to selectively delay data communication between the memory controller and the data input/output buffers during data read/write operations.

The memory controller may be further configured to determine delays for the plurality of variable delay circuits, and to transmit the determined delays for the plurality of variable delay circuits to the delay controller so that subsequent read/write operations are performed with the variable delay circuits providing the respective determined delays. For example, the memory controller may be configured to determine differences in alignments of data communicated between the memory controller and the plurality of data input/output buffers and to determine the delays for the plurality of variable delay circuits responsive to the differences in alignments. More particularly, the delay controller may be configured to select delays to be provided by each of the variable delay circuits responsive to a Mode Register Set (MRS) instruction received from the memory controller during an MRS operation. The delay controller may be configured to select a first delay to be provided by one of the variable delay circuits during a first period and to select a second delay to be provided by the one of the variable delay circuits during a second period, and the first and second delays may be different.

The plurality of data input/output buffers may include respective input buffers configured to write data received from the memory controller to the memory cell array responsive to the clock signals received at the clock inputs of the respective input/output buffers during write operations. The plurality of input buffers may be configured to receive a respective plurality of data bits in parallel during a same write operation responsive to a same edge of the clock signal. The memory controller may be configured to perform write data training to selectively delay data transmission to the input buffers so that reception of the data at the input buffers is aligned with the clock signals received at the different input/output buffers during write operations.

The plurality of data input/output buffers may include respective output buffers configured to transmit data read from the memory cell array to a memory controller responsive to the clock signals received at the clock inputs of the respective input/output buffers during read operations. The plurality of output buffers may be configured to transmit a respective plurality of data bits in parallel during a same read operation responsive to a same edge of the clock signal. The memory controller may be configured to perform read data training to selectively delay data reception at the memory controller from the input buffers.

According to still more embodiments of the present invention, an integrated circuit memory device may include a memory cell array having a plurality of memory cells and a plurality of data input/output buffers coupled between respective data input/output pads and the memory cell array. A method of operating such an integrated circuit memory device may include generating a clock signal, and during a first read/write operation, providing a first set of time delays for the clock signal at the input/output buffers so that different time delays are provided for the clock signal received by at least two of the input/output buffers. During the first read/write operation, data may be communicated between a memory controller and the memory cell array while providing the first set of time delays for the clock signal at the input/output buffers. During a second read/write operation, a second set of time delays may be provided for the clock signal at the input/output buffers so that different time delays are provided for the clock signal received by at least two of the input/output buffers, and the first and second sets of time delays may be different. During the second read/write operation, data may be communicated between the memory controller and the memory cell array while providing the second set of time delays for the clock signal at the input/output buffers.

The plurality of data input/output buffers may include respective input buffers, and the first and second read/write operations may be respective first and second write operations. Communicating data between the memory controller and memory cell array during the first write operation may include receiving a first plurality of data bits in parallel at the respective input buffers, and communicating data between the memory controller and memory cell array during the second write operation may include receiving a second plurality of data bits in parallel at the respective input buffers.

The plurality of data input/output buffers may include respective output buffers, and the first and second read/write operations may include respective first and second read operations. Communicating data between the memory controller and memory cell array during the first read operation may include transmitting a first plurality of data bits in parallel from the respective input buffers, and communicating data between the memory controller and memory cell array during the second read operation may include transmitting a second plurality of data bits in parallel from the respective input buffers.

DETAILED DESCRIPTION

Figure 1:
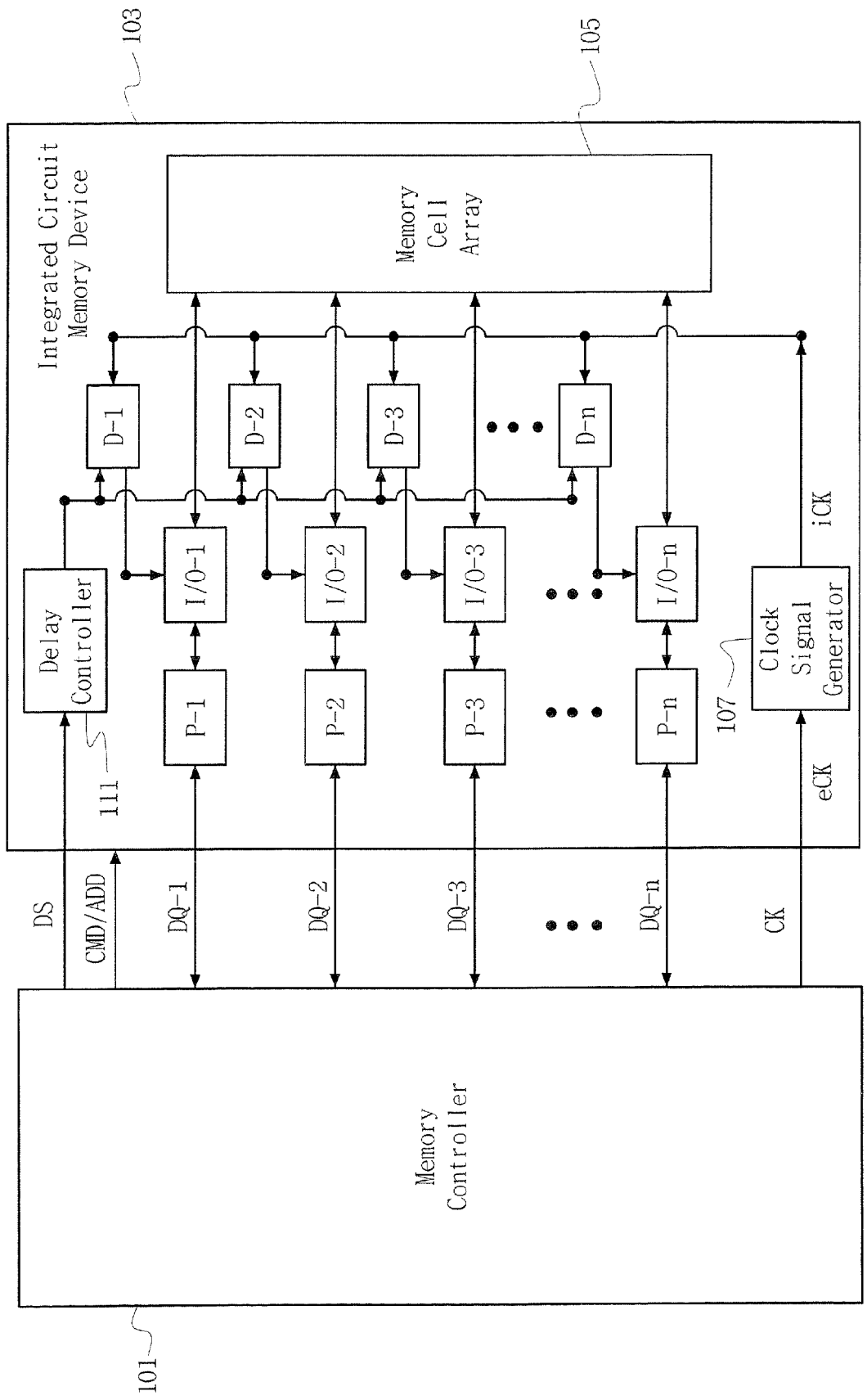
FIG. 1 is a block diagram illustrating memory systems according to some embodiments of the present invention.

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety.

According to some embodiments of the present invention, a memory system may include an integrated circuit (IC) memory device 103 and a memory controller 101 electrically coupled through a plurality of data input/output transmission lines DQ-1 to DQ-n (also referred to as data transmission lines or transmission lines), a plurality of command/address lines CMD/ADD, and a clock signal line CK, as shown in FIG. 1. During write operations, the memory controller 101 may transmit a plurality of data bits in parallel over the data input/output transmission lines DQ-1 to DQ-n, and the IC memory device may write the data to memory cell array 105 responsive to a write command and address information received over command/address lines CMD/ADD and responsive to an external clock signal received over clock signal line CK. During read operations, IC memory device 103 may transmit data read from memory cell array 105 over data input/output transmission lines DQ-1 to DQ-n to memory controller 101 responsive to a read command and address information received over command/address lines CMD/ADD and responsive to an external clock signal received over clock signal line CK. The memory controller 101 may receive the data read from the IC memory device 103.

IC memory device 103 may include memory cell array 105 having a plurality of memory cells, for example, arranged in plurality of rows and columns, and a clock generator 107 configured to generate an internal clock signal. Memory cells of memory cell array 105, for example, may include dynamic random access memory (DRAM) cells, static random access memory (SRAM) cells, magnetic random access memory (MRAM) cells, phase-change random access memory (PRAM) cells, flash memory cells, electrically erasable programmable read only memory (EEPROM) cells, etc. Moreover, the IC memory device 103 may be configured to provide DRAM functionality, double data rate (DDR) functionality, graphics double data rate (GDDR) functionality, etc. As shown in FIG. 1, the clock signal generator 107 may be configured to generate internal clock signal iCK responsive to an external clock signal eCK received from memory controller 101 over clock signal line CK. According to other embodiments of the present invention, the clock signal generator 107 may be configured to generate internal clock signal iCK independently. According to still other embodiments of the present invention, the clock signal generator 107 may be an input pad that receives an external clock signal eCK from memory controller 101 and provides internal clock signal iCK to delay circuits D-1 to D-n without further processing. According to yet other embodiments of the present invention, the clock signal generator 107 may be a buffer/amplifier that buffers/amplifies the external clock signal eCK to provide internal clock signal iCK.

A plurality of data input/output buffers I/O-1 to I/O-n may be coupled between respective data input/output pads P-1 to P-n and memory cell array 105, and each of the data input/output buffers I/O-1 to I/O-n may be configured to communicate data with memory cell array 105 responsive to internal clock signal iCK generated by clock signal generator 107 with the internal clock signal iCK being applied to a clock input of each of the input/output buffers I/O-1 to I/O-n. A plurality of delay circuits D-1 to D-n may be provided with each delay circuit D-1 to D-n being coupled between clock signal generator 107 and a respective one of the data input/output buffers I/O-1 to I/O-n. Moreover, at least some of the delay circuits D-1 to D-n may provide different delays so that the internal clock signal is delayed by different amounts at clock inputs of at least first and second ones of the data input/output buffers I/O-1 to I/O-n. More particularly, a difference in phase of the clock signal iCK received at the first and second ones of the data input/output buffers may be greater than about 180 degrees. While a delay circuit is shown for each input/output buffer of FIG. 1, delay circuits may be provided for some of the input/output buffers, while other input/output buffers may be coupled directly to the clock signal generator 107 without an intervening delay circuit according to some embodiments of the present invention. For example, a delay circuit may be provided for even ones of input/output buffers I/O-1 to I/O-n while odd ones of the input/output buffers I/O-1 to I/O-n may be coupled to clock signal generator 107 without intervening delay circuits.

The memory controller 101 may perform data training to selectively delay data communication between the memory controller 101 and data input/output buffers I/O-1 to I/O-n during subsequent data read/write operations. By using the delay circuits D-1 to D-n to provide different delays for the internal clock signal iCK at the input/output buffers I/O-1 to I/O-n and by using data training to align parallel data transmitted by the memory controller with the different clock signal delays at the different input/output buffers I/O-1 to I/O-n, parallel data can be transmitted over the data input/output transmission lines DQ-1 to DQ-n with different delays/phases so that not all of the bits of parallel data are received at the IC memory device 103 at the same time. Accordingly, detrimental impact (such as jitter) due to simultaneous switching noise (SSN), cross talk between adjacent transmission lines, etc. may be reduced thereby providing increased setup/hold margins.

Figure 2:
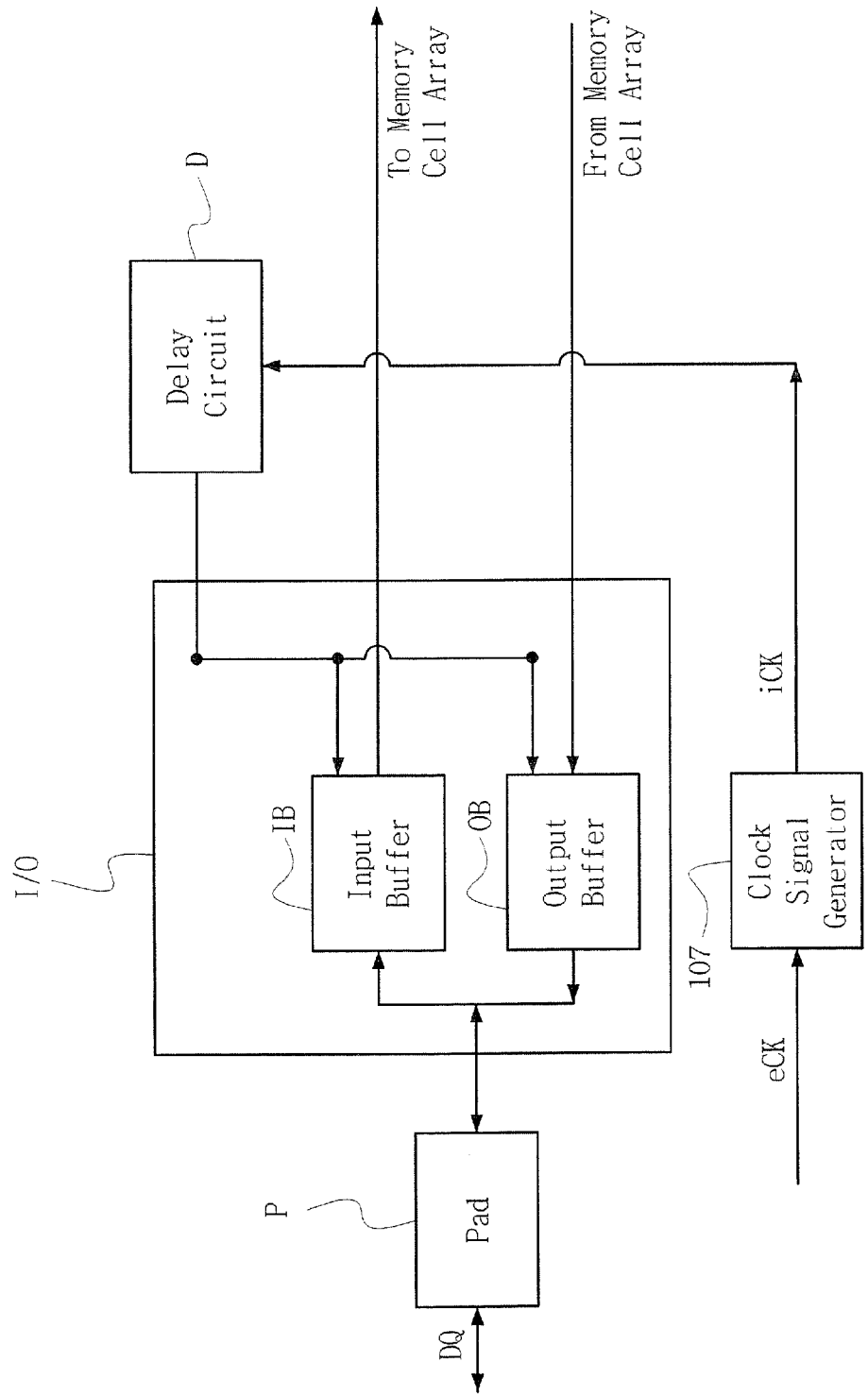
FIG. 2 is a block diagram illustrating an input/output buffer and an associated delay circuit according to some embodiments of the present invention.

FIG. 2 is a block diagram illustrating an example of a single one of the input/output buffers I/O-1 to I/O-n according to some embodiments of the present invention, and couplings to a respective pad P and delay circuit D. As shown in FIG. 2, an input/output buffer I/O may include an input buffer IB and an output buffer OB both coupled to the same delay circuit D and to the same input/output pad P. The data input buffer IB may be configured to write data received from the memory controller 101 to the memory cell array 105 responsive to the delayed clock signal received at the clock input from delay circuit D during a write operation. More particularly, the input buffer IB may include a flip-flop having a clock input configured to receive the delayed clock signal from delay circuit D, a data input coupled to the respective data input pad P, and a data output coupled to the memory cell array.

The data input/output buffer I/O may include an output buffer OB configured to transmit data read from the memory cell array 105 to the memory controller 101 responsive to the delayed clock signal received at the clock input from the delay circuit D during read operations. The output buffer OB may include a flip-flop having a clock input configured to receive the delayed clock signal from delay circuit D, a data output coupled to the respective data input/output pad P, and a data input coupled to the memory cell array 105.

Figure 3:
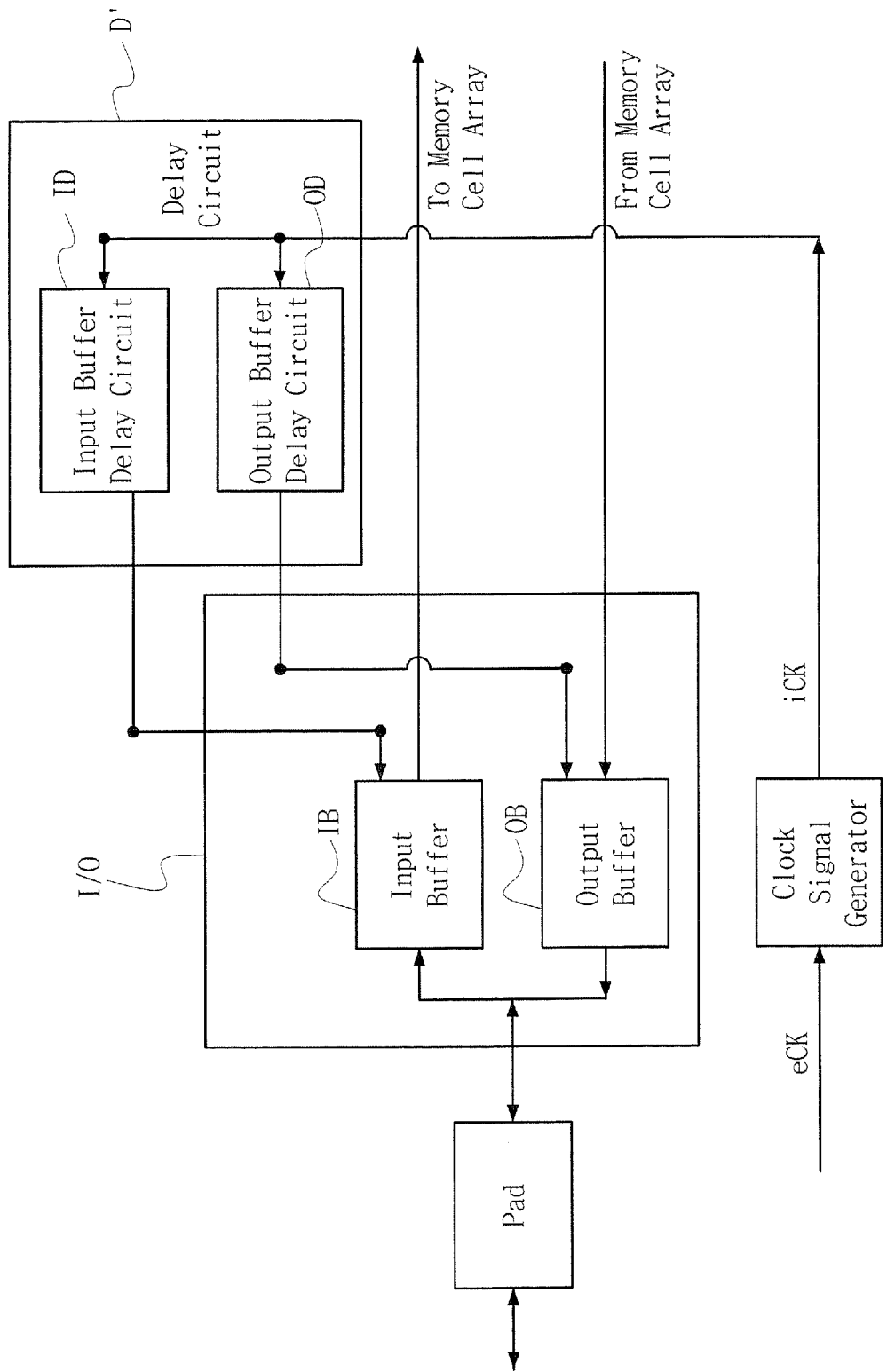
FIG. 3 is a block diagram illustrating an input/output buffer and an associated delay circuit according to some other embodiments of the present invention.

As shown in FIG. 2, the delay circuit D may provide a single delay for the internal clock signal iCK so that the same delayed clock signal is applied to both the input buffer IB and the output buffer OB. According to other embodiments of the present invention illustrated in FIG. 3, a delay circuit D may include an input buffer delay circuit ID for the input buffer and an output buffer delay circuit OD for the output buffer. Accordingly, different clock delays may be provided for write (input) and read (output) paths through the same input/output buffer I/O.

Figure 4A:
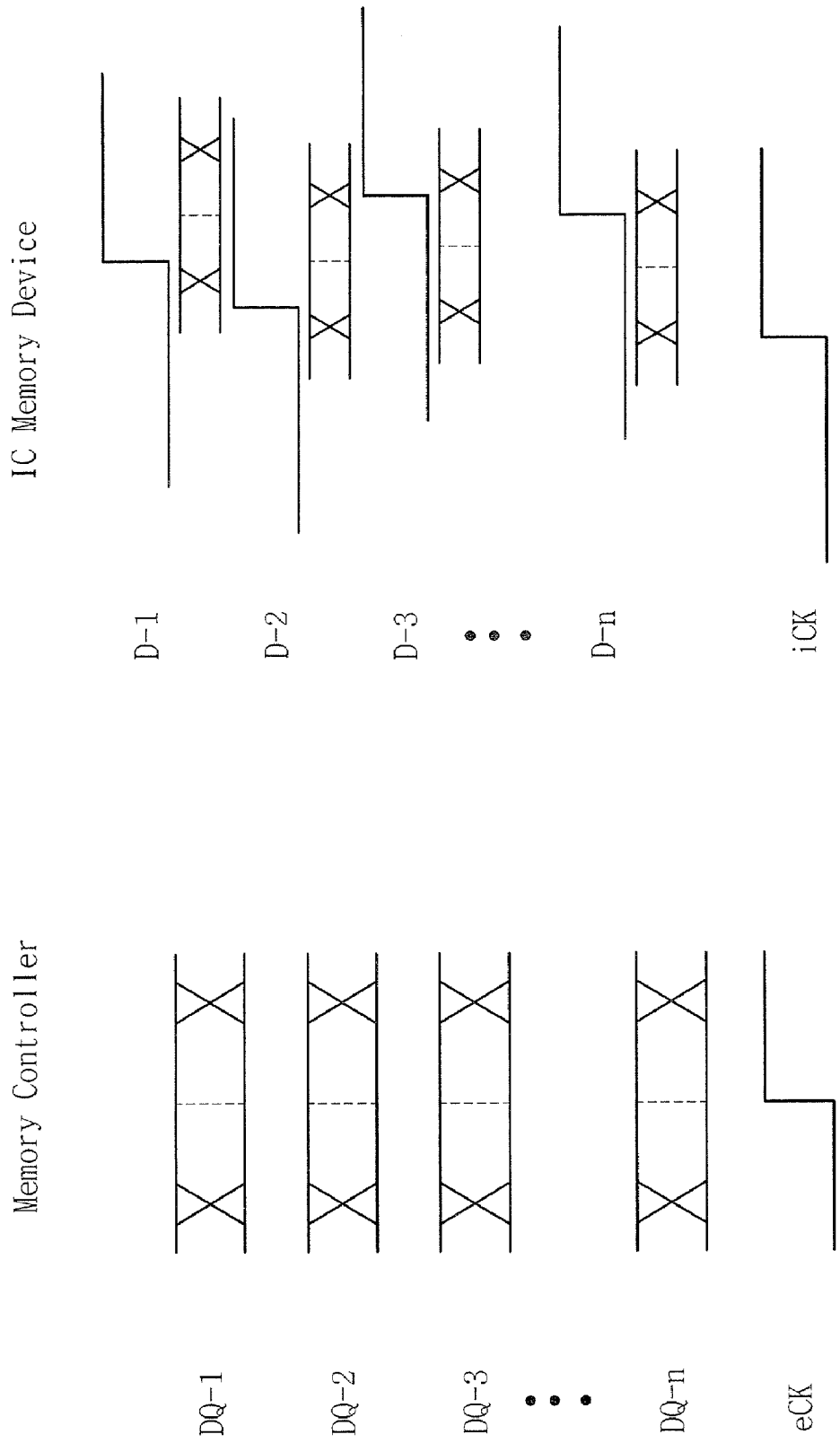
FIGS. 4A and 4B are timing diagrams illustrating data training according to some embodiments of the present invention.
Figure 4B:
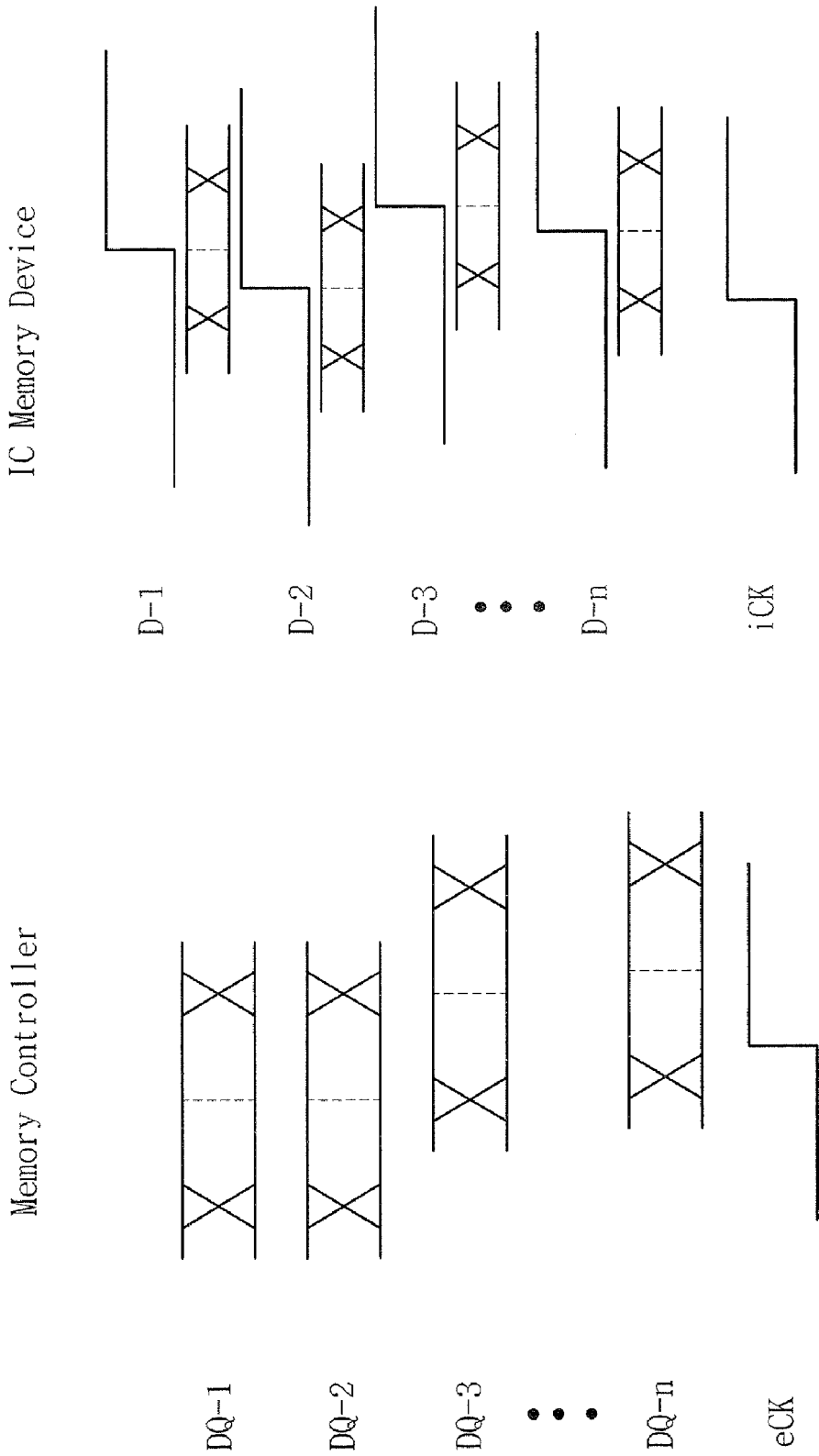

Examples of write data training for the memory system including memory controller 101 and IC memory device 103 according to embodiments of the present invention are illustrated in FIGS. 4A and 4B. As shown in FIG. 4A, delay circuits D-1, D-2, D-3, and D-n may provide different delays of the internal clock signal iCK for the respective input/output buffers I/O-1, I/O-2, I/O-3, and I/O-n. For example, delay circuit D-1 may provide a 50 picosecond delay, delay circuit D-2 may provide a 25 picosecond delay, delay circuit D-3 may provide a 100 picosecond delay, and delay circuit D-n may provide a 75 picosecond delay. During a data write operation before data training, the memory controller 101 may transmit parallel data bits over transmission lines DQ-1, DQ-2, DQ-3, and DQ-n in relative alignment with respect to the external clock signal eCK. Due to differences in transmission delays over transmission lines DQ-1, DQ-2, DQ-3, and DQ-n, the parallel data bits may be received at different times at respective input/output buffers I/O-1, I/O-2, I/O-3, and I/O-n of IC memory device 103. Moreover, different delays of the internal clock signal iCK at the respective input/output buffers may provide further misalignment of reception of the parallel data bits and the delayed clocks at the respective input/output buffers.

In order to better align the delayed clock signals provided by the delay circuits D-1, D-2, D-3, and D-n and the data received at the input/output buffers I/O-1, I/O-2, I/O-3, and I/O-n of IC memory device 103, the memory controller 101 may perform write data training to selectively delay/advance transmission of individual bits relative to the external clock signal eCK during write operations. Stated in other words, phases of transmission of the parallel data bits from the memory controller 101 may be adjusted relative to the external clock signal eCK as shown in FIG. 4B to provide that the data is received at the respective input/output buffers I/O-1, I/O-2, I/O-3, and I/O-n in alignment with the respective delayed internal clock signals from delay circuits D-1, D-2, D-3, and D-n. The input/output buffers I/O-1, I/O-2, I/O-3, and I/O-n may thus be configured to receive a respective plurality of data bits in parallel during a same write operation responsive to a same edge of the internal clock signal iCK with the same edge of the internal clock signal iCK being delayed differently for different ones of the input/output buffers.

The memory controller 101 may thus be configured to provide write data training so that data communication between the memory controller 101 and the IC memory device 103 is selectively delayed across the different transmission lines DQ-1 to DQ-n during read and/or write operations. During data write training, for example, respective delays for transmission of parallel data from memory controller 101 over transmission lines DQ-1 to DQ-n may be determined so that data reception at each of the input/output buffers I/O-1 to I/O-n is substantially centered relative to the delayed clock signal received at each of the input/output buffers.

Figure 5A:
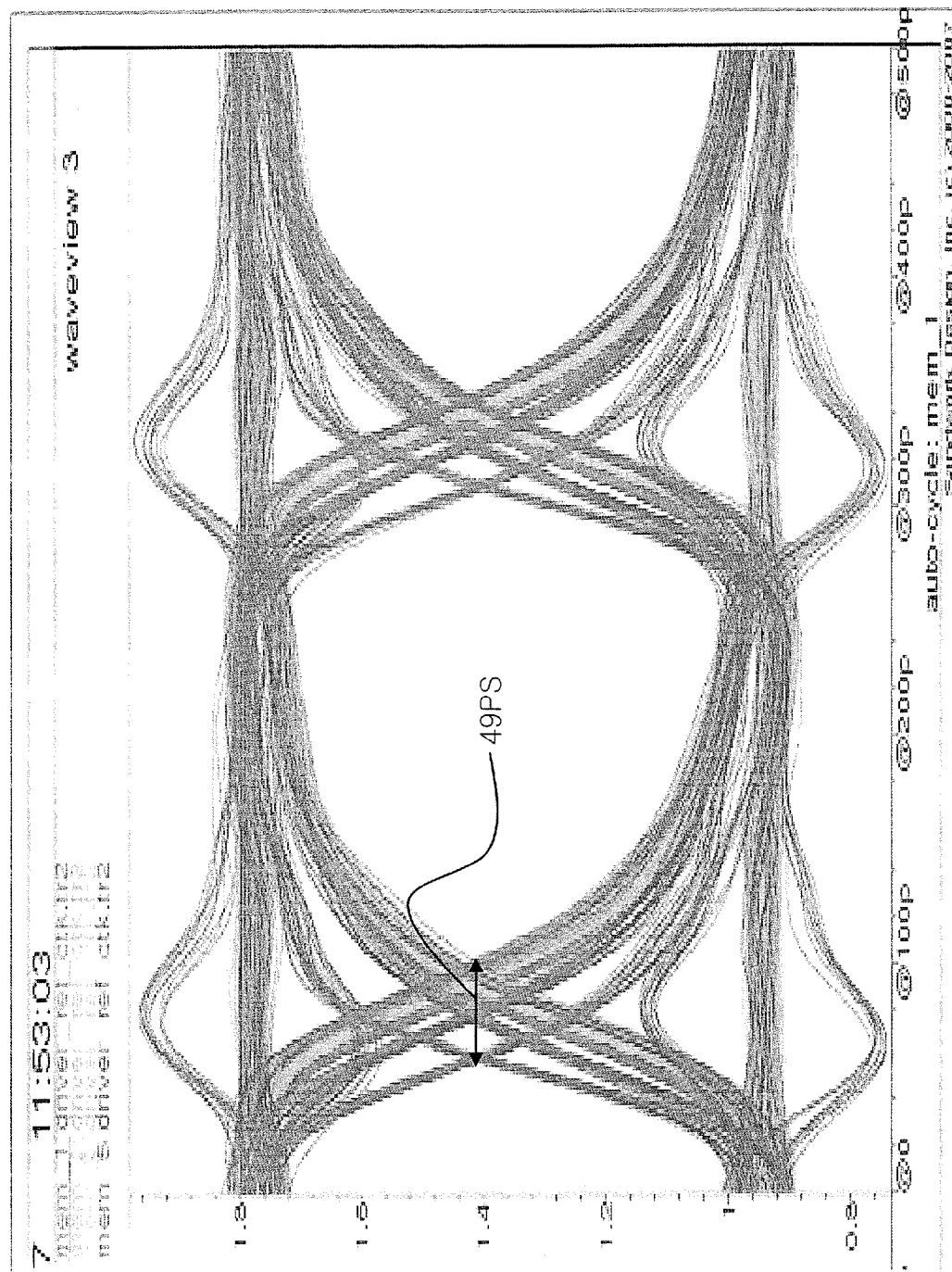
FIGS. 5A and 5B are graphical diagrams illustrating simulations of even and odd data reception without different clock signal delays at input/output buffers.
Figure 5B:
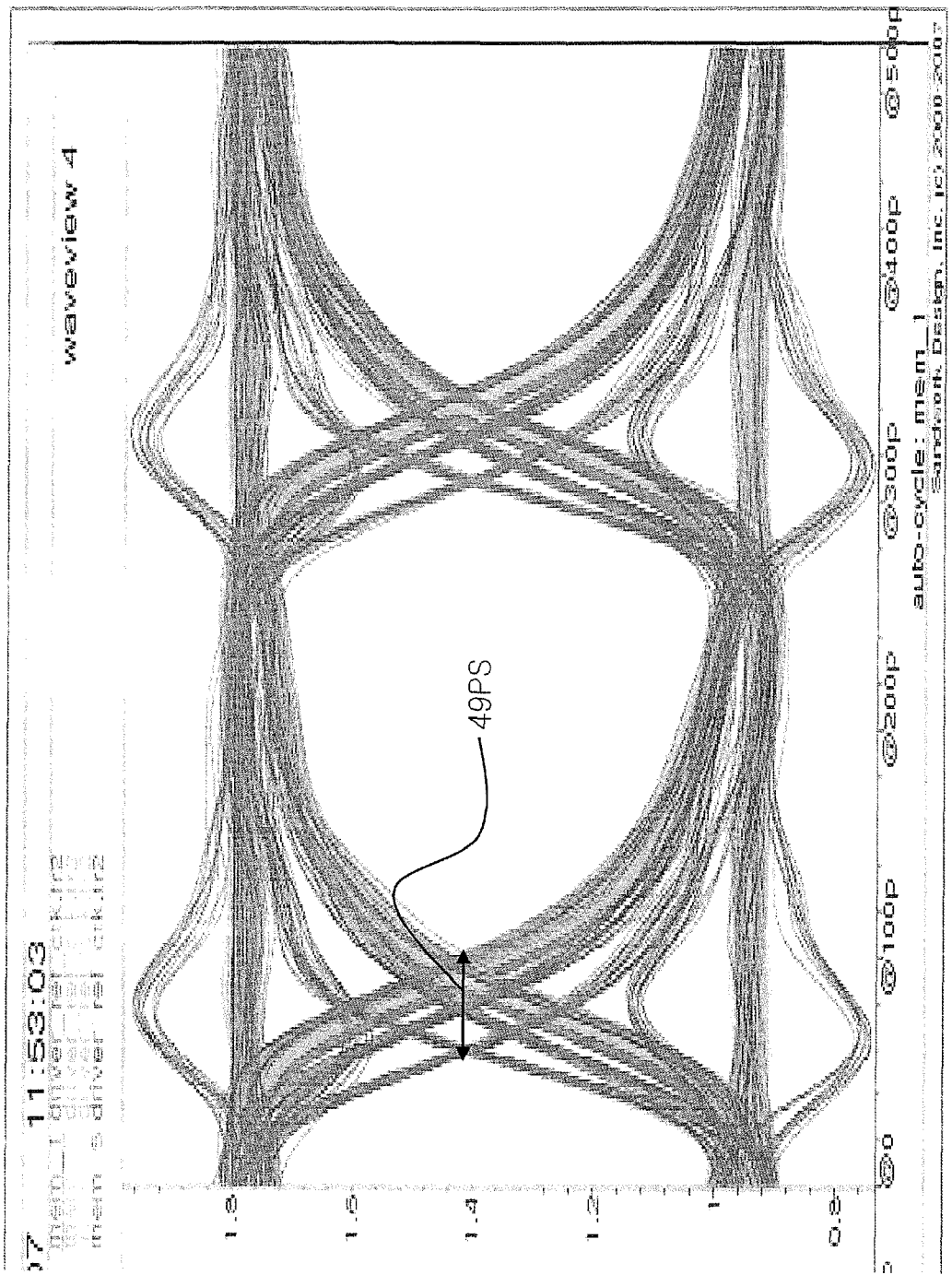

FIGS. 5A and 5B are graphical eye diagrams illustrating simulations of even and odd data reception at the IC memory device 103 when the same delays (e.g., no delays) are provided by the delay circuits D-1 to D-n so that parallel data from memory controller 101 is received over parallel transmission lines DQ-1 to DQ-n at substantially the same time. Separate graphs are provided because even data bits for a memory write operation may be transmitted over transmission lines DQ-1 to DQ-n as shown in FIG. 5A followed by transmission of odd data bits over transmission lines DQ-1 to DQ-n for the same memory write operation as shown in FIG. 5B. More particularly, the x-axes of FIGS. 5A and 5B represent time in units of picoseconds, the y-axes represent voltage in units of volts, and the signals represent a simulation of a received Pseudo Random Bit Sequence (PRBS) transmitted at 4 Gbps. As shown in FIGS. 5A and 5B, jitter may result from simultaneous switching noise (SSN), cross talk between adjacent transmission lines, etc. More particularly, a jitter of about 49 ps (picoseconds) may result thereby reducing setup/hold margins.

Figure 6A:
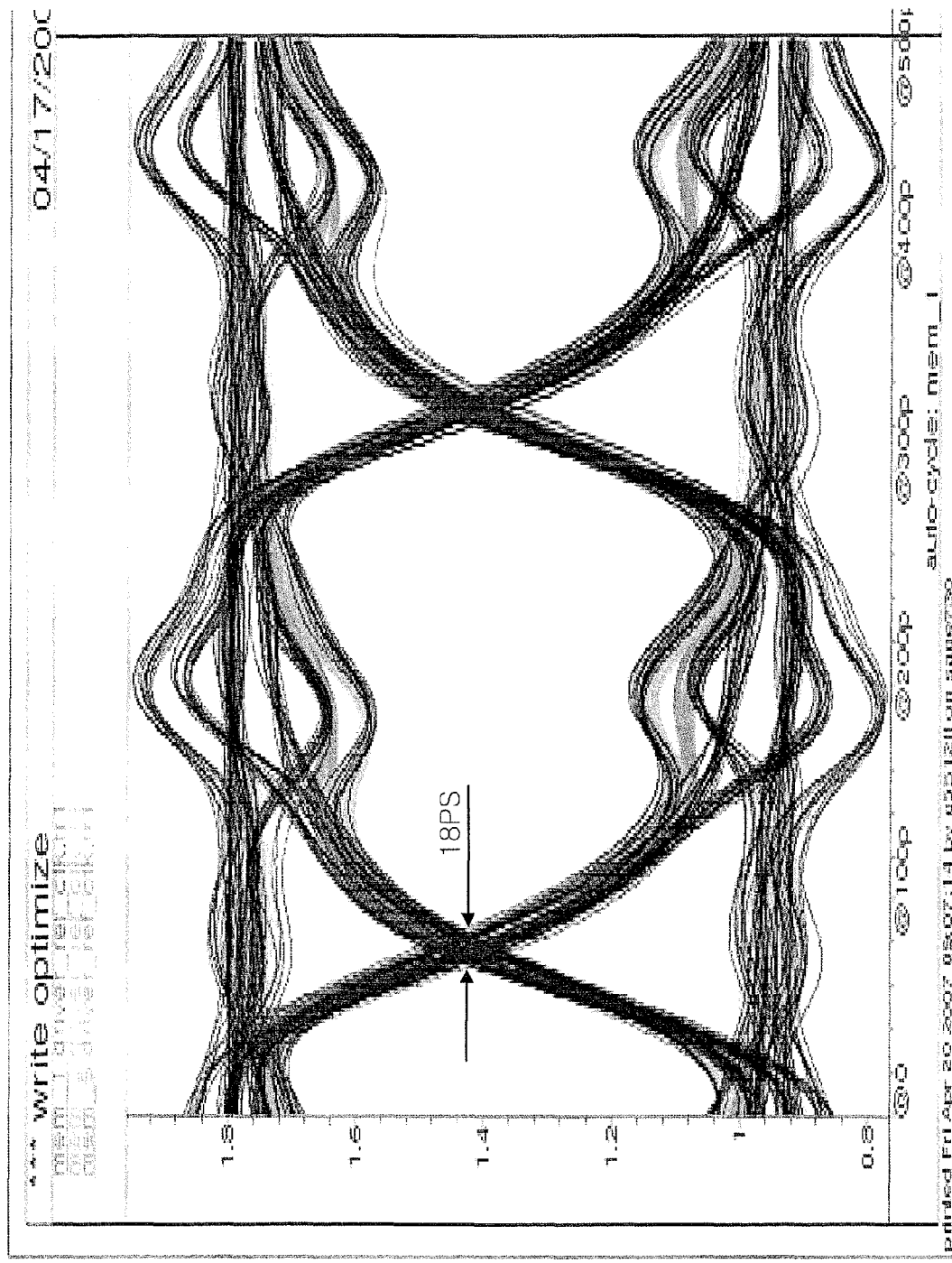
FIGS. 6A and 6B are graphical diagrams illustrating simulations of even and odd data reception with different clock signal delays at input/output buffers according to some embodiments of the present invention.
Figure 6B:
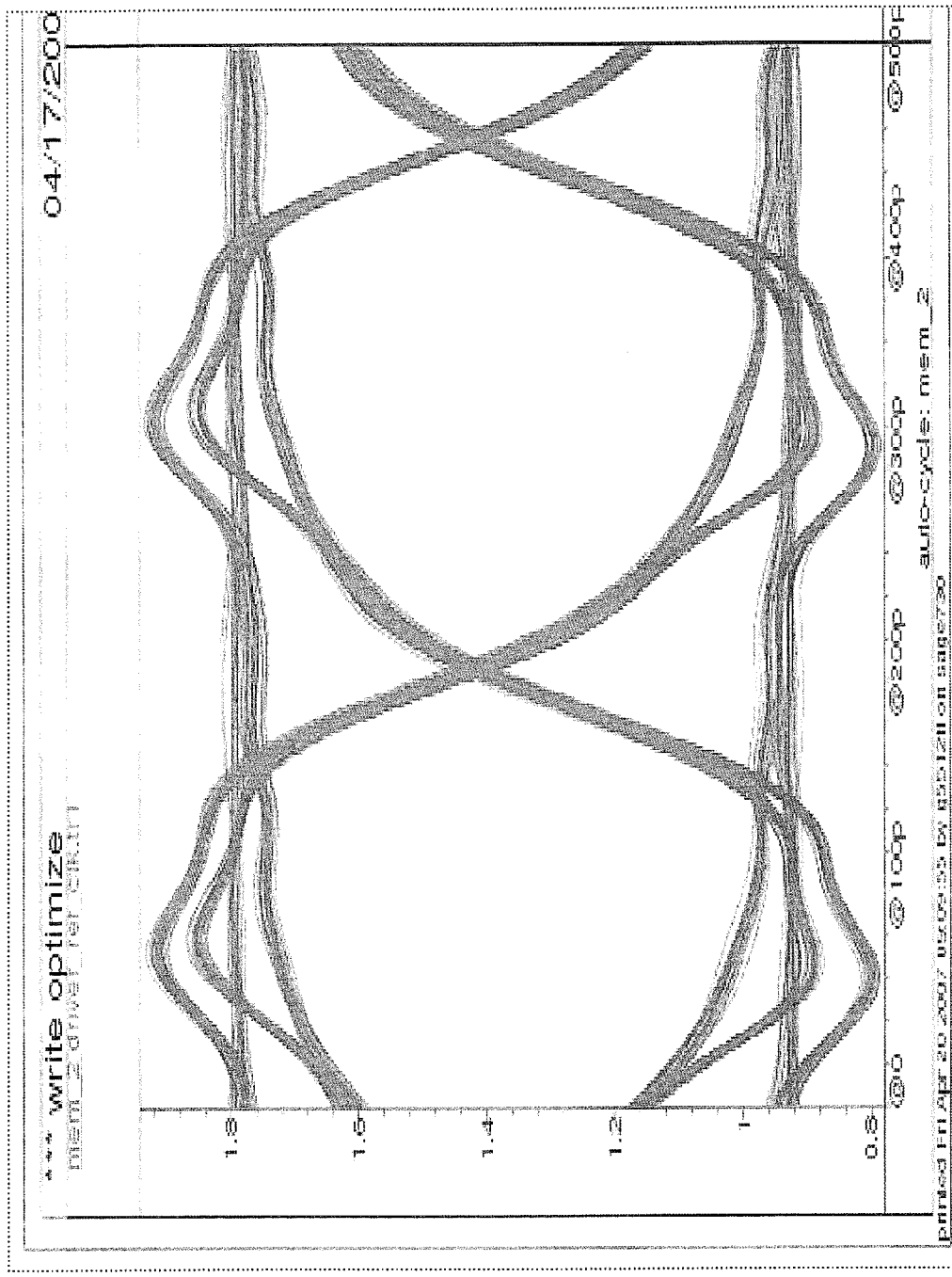

FIGS. 6A and 6B are graphical eye diagrams illustrating simulations of even and odd data reception at the IC memory device 103 when different delays are provided by at least some the delay circuits D-1 to D-n (where n=8) so that parallel data from memory controller 101 is received over parallel transmission lines DQ-1 to DQ-n at different times. Eight bits of even data and eight bits of odd data may be provided to accommodate Double Data Rate (DDR) operations. Separate graphs are provided because even data bits for a memory write operation may be transmitted over transmission lines DQ-1 to DQ-n as shown in FIG. 6A followed by transmission of odd data bits over transmission lines DQ-1 to DQ-n for the same memory write operation as shown in FIG. 6B to accommodate DDR operations. More particularly, the x-axes of FIGS. 6A and 6B represent time in units of picoseconds, the y-axes represent voltage in units of volts, and the signals represent a simulation of a received Pseudo Random Bit Sequence (PRBS) transmitted at 4 Gbps. As shown in FIGS. 6A and 6B, jitter of parallel data resulting from simultaneous switching noise (SSN), cross talk between adjacent transmission lines, etc. may be significantly reduced because the parallel data bits are transmitted at different times. In particular, a jitter of about 18 ps (picoseconds) may result thereby increasing setup/hold margins relative to the scenario discussed above with respect to FIGS. 5A and 5B. Accordingly, a reduction in jitter of about 31 ps may be obtained by providing different delays of the clock signal at the different input/output buffers I/O-1 to I/O-n.

As discussed above with respect to FIGS. 2 and 3, each input/output buffer I/O-1 to I/O-n may include a respective input buffer and a respective output buffer, and the different delay circuits D-1 to D-n may be used to provide different delays of the internal clock signal iCK at different ones of the input buffers and at different ones of the output buffers. By providing different delays of the internal clock signal iCK for different ones of the input buffers together with write data training, jitter during write operations may be reduced as discussed above with respect to FIGS. 4A-B, 5A-B, and 6A-B.

As discussed above with respect to FIGS. 2 and 3, different delays of the internal clock signal iCK may also be provided for output buffers of the input/output buffers I/O-1 to I/O-n. Accordingly, the memory controller 101 may be configured to perform read data training to selectively delay data reception at the memory controller from the input/output buffers I/O-1 to I/O-n. By providing different delays of the internal clock signal iCK for different ones of the input buffers together with read data training, jitter during read operations may be reduced. Output buffers of the input/output buffers I/O-1 to I/O-n may thus be configured to transmit a respective plurality of data bits in parallel during a same read operation responsive to a same edge of the internal clock signal with different delays of the internal clock signal being provided at different ones of the output buffers.

According to some embodiments of the present invention, the delay circuits D-1 to D-n may provide respective fixed delays for the internal clock signal iCK. With fixed delays, the delay controller 111 may be omitted. According to other embodiments of the present invention, one or more of the delay circuits D-1 to D-n may include respective variable delay circuits and each of the variable delay circuits may be configured to provide one of a plurality of different time delays for the clock signal responsive to an input signal provided by delay controller 111. More particularly, delay controller 111 may be coupled to each of the variable delay circuits D-1 to D-n, and the delay controller 111 may be configured to select delays to be provided by each of the variable delay circuits D-1 to D-n.

For example, the delay controller 111 may be configured to select delays responsive to instructions received from the memory controller 101. More particularly, the delay controller 111 may be configured to select respective delays for variable delay circuits D-1 to D-n responsive to a Mode Register Set (MRS) instruction received from memory controller 101 during a MRS operation. Mode Register Set instructions and operations for memory devices and systems are discussed, for example, in U.S. Pat. No. 6,834,014, U.S. Pat. No. 7,102,958, U.S. Pat. No. 7,277,356, U.S. Publication No. 2006/0161745, and U.S. Publication No. 2007/0291575, the disclosures of which are incorporated herein in their entirety by reference. Accordingly, a delay controller may provide different delays during different time periods responsive to different instructions received from the memory controller.

According to some embodiments of the present invention, the plurality of delay circuits D-1 to D-n may include a different delay circuit between the clock signal generator 107 and each of the data input/output buffers I/O-1 to I/O-n so that each different delay circuit delays the clock signal by a different amount. According to other embodiments of the present invention, some of the plurality of delay circuits D-1 to D-n may provide different delays while others of the delay circuits D-1 to D-n may provide a same delay. For example, delay circuits D-1 to D-n for adjacent input/output pads P-1 to P-n may provide different delays, while delay circuits D-1 to D-n for some non-adjacent input/output pads P-1 to P-n may provide a same delay. According to still other embodiments of the present invention, a delay circuit may be interpreted to include a line directly coupling the clock signal generator iCK and the respective input/output buffer so that the delay circuit provides substantially no delay, and other delay circuits of the IC memory device may include one or more delay buffers providing additional delay relative to the delay circuit providing substantially no delay.

Figure 7:
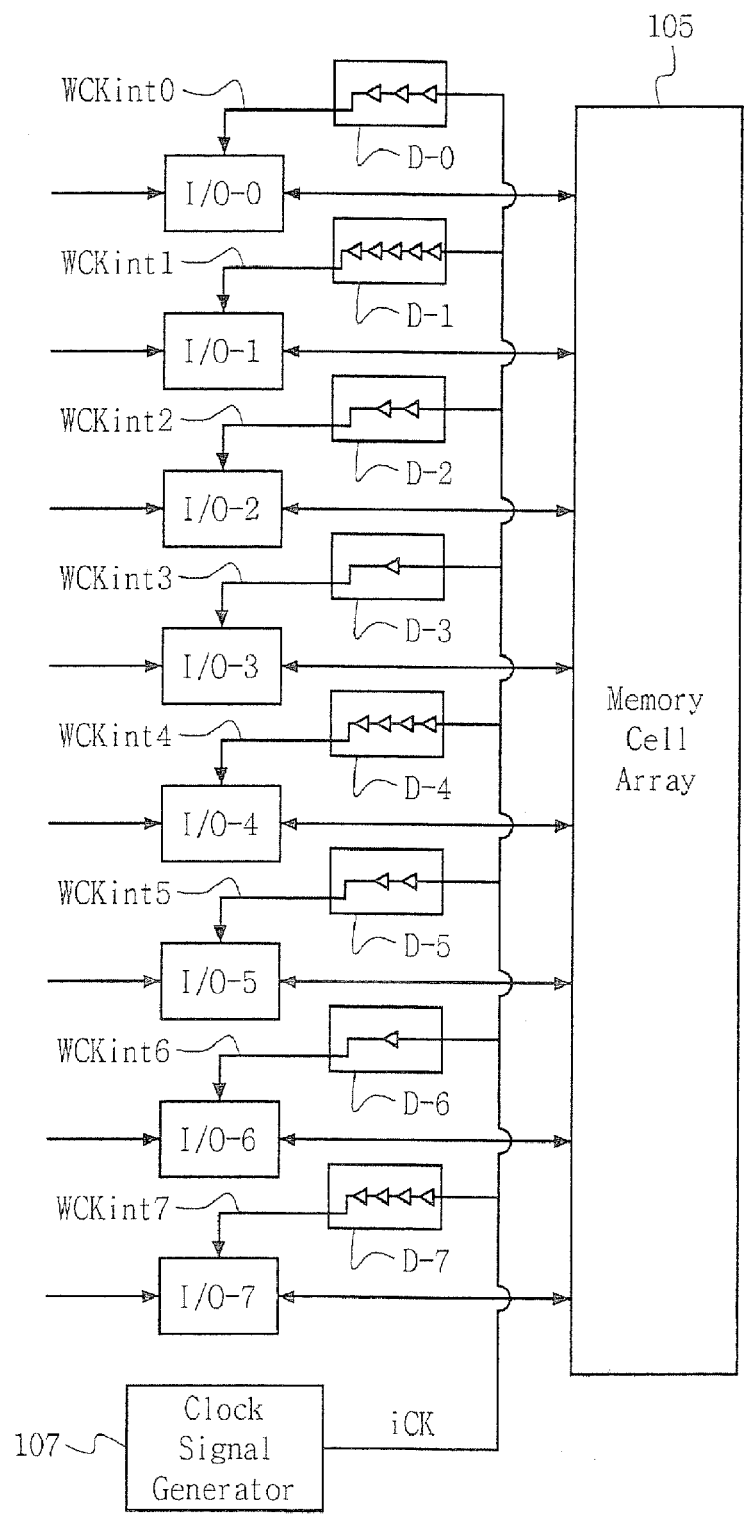
FIG. 7 is a block diagram illustrating particular delay circuits according to some embodiments of the present invention.
Figure 8:
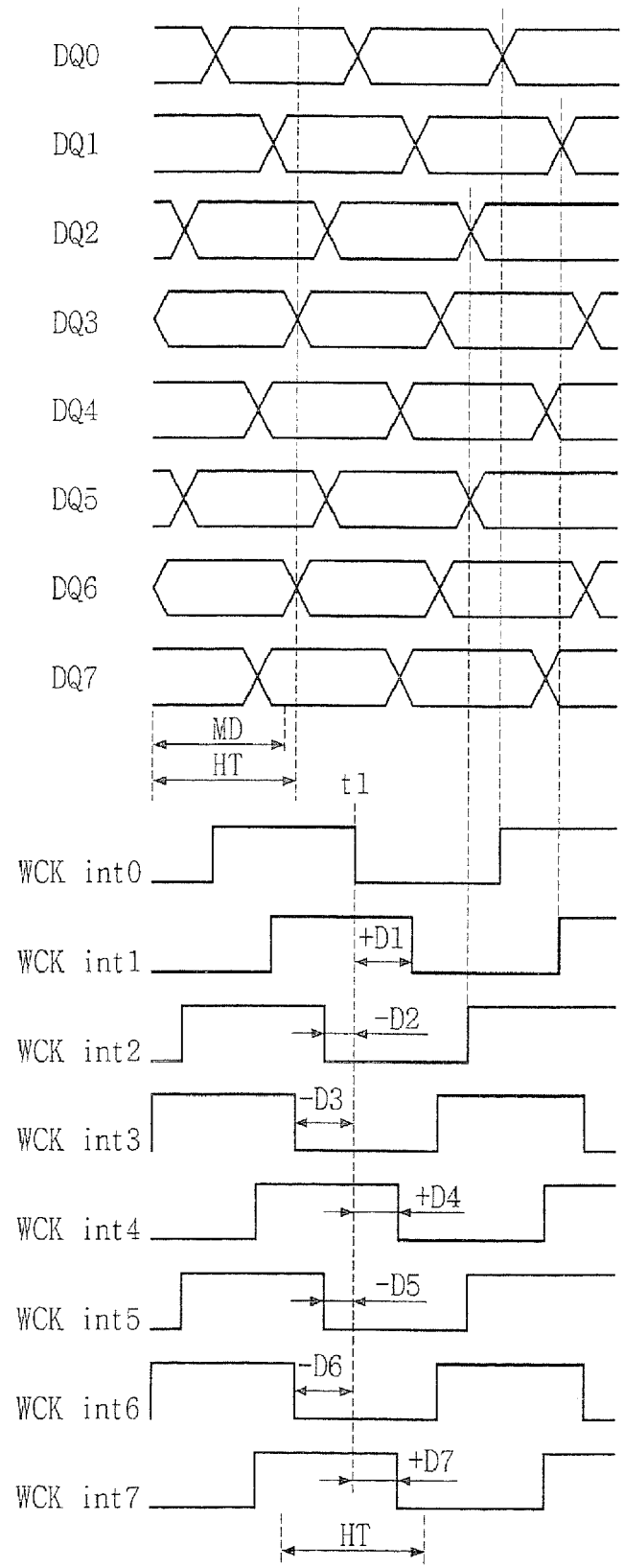
FIG. 8 is a waveform diagram illustrating outputs of respective delay circuits and respective data inputs for the input/output buffers of FIG. 7 according to some embodiments of the present invention.

FIG. 7 is a block diagram illustrating particular delay circuits according to some embodiments of the present invention, and FIG. 8 is a waveform diagram illustrating outputs WCKint0 to WCKint7 of respective delay circuits D-0 to D-n and respective data inputs DQ0 to DQn for the input/output buffers I/O-1 to I/O-n. As shown in FIG. 7, delay circuit D-0 may include three delay elements, delay circuit D-1 may include five delay elements, delay circuit D-2 may include two delay elements, delay circuit D-3 may include one delay element, delay circuit D-4 may include four delay elements, delay circuit D-5 may include two delay elements, delay circuit D-6 may include one delay element, and delay circuit D-7 may include four delay elements. More generally, by providing different delays for adjacent ones of input/output buffers I/O-1 to I/O-n, some of the most significant sources of simultaneous switching noise and/or cross talk may be reduced. Each of the delay circuit outputs WCKint0 to WCKint7 may have a positive or negative delay relative to a time reference t1 as shown in FIG. 8. By providing different delays, simultaneously switching noise (SSN) may be reduced by reducing a number of simultaneous clock toggles.

As shown in FIG. 7, non-adjacent delay circuits D-3 and D-6 may have a same number of delay elements and may thus provide substantially the same delays. Moreover, each of the delay elements may include a delay buffer, such as a pair of serially coupled inverting buffers.

In FIG. 7, the number of delay elements of each delay circuit corresponds to respective portions of the waveform diagram of FIG. 8. For example, when delay circuit output WCKint0 is obtained using three delay elements of delay circuit D-0, to achieve a waveform of a delay circuit output WCKint1 (which is shifted in time by +D1 as shown in FIG. 8), delay circuit D-1 may include five delay elements. Similarly, delay circuit D-2 may have two delay elements to provide delay circuit output WCKint2, and delay circuit D-3 may have one delay element to provide delay circuit output WCKint3. Moreover, since data inputs DQ0 to DQ7 of FIG. 8 are obtained using data training, input timings of the data input DQ0 may be in sync with the rising and falling edges of delay circuit output WCKint0 without skew. Further, input timings of data input DQ1 may be in sync with the rising and falling edges of the delay circuit output WCKint1, and input timings of data input DQ2 may be in sync with rising and falling edges of delay circuit output WCKint2. Accordingly, input timings of data inputs DQ0 to DQ7 may be in sync with rising and falling edges of delay circuit outputs WCKint0 to WCKint7, respectively.

With reference to the block diagram of FIG. 1, some of the delay circuits D-1 to D-n may be configured to provide substantially no delay. A delay circuit providing substantially no delay, for example, may merely provide a direct electrical coupling between the respective input/output buffer and the clock signal generator, or a delay circuit providing substantially no delay may be a variable delay circuit including a switch to bypass variable delay elements thereof. By way of example, delay circuits D-1 and D-3 of FIG. 1 may provide substantially no delay, and the delay circuit D-2 may provide a phase delay of at least 180 degrees so that a phase of the clock signal iCK received at input/output buffer I/O-2 is delayed by at least 180 degrees relative to a phase of the clock signal iCK received at input/output buffers I/O-1 and I/O-3.

According to other embodiments of the present invention shown in FIG. 1, delay circuits may be provided for even ones of the input/output buffers (e.g., I/O-2, I/O-4, etc.) while odd ones of the input/output buffers (e.g., I/O-1, I/O-3, etc.) may be coupled directly to the clock signal generator 107 (without intervening delay circuits), or delay circuits may be provided for odd ones of the input/output buffers while even ones of the input/output buffers may be coupled directly to the clock signal generator 107 (without intervening delay circuits). Stated in other words, delay circuits may be provided for every other one of the input/output buffers of FIG. 1 to reduce an area of the integrated circuit device occupied by delay circuits. By providing delay circuits providing a phase delay of at least 180 degrees for the clock signal iCK for every other one of the delay circuits, adjacent input/output buffers will receive the clock signal iCK offset in phase by at least 180 degrees.

According to some embodiments of the present invention, memory controller 101 and/or delay controller 111 of FIG. 1 may vary delays provided by delay circuits D-1 to D-n based on data patterns being transmitted over transmission lines DQ-1 to DQ-n during different write operations. For example, a first set of delays may be desirable for delay circuits D-1 to D-n when a number of 0's is greater than a number of 1's being transmitted in parallel over transmission lines DQ-1 to DQ-n during a write operation, and a second set of delays (different than the first set of delays) may be desirable for delay circuits D-1 to D-n when a number of 0's is less than a number of 1's being transmitted in parallel over transmission lines DQ-1 to DQ-n during a write operation. According to another example, a third set of delays may be desirable for delay circuits D-1 to D-n when a number of 0's being transmitted over even ones of the transmission lines DQ-1 to DQ-n is greater than a number of 0's being transmitted over odd ones of the transmission lines DQ-1 to DQ-n during a write operation, and a fourth set of delays (different than the third set of delays) may be desirable for delay circuits D-1 to D-n when a number of 0's being transmitted over even ones of the transmission lines DQ-1 to DQ-n is less than a number of 0's being transmitted over odd ones of the transmission lines DQ-1 to DQ-n during a write operation. Data training may also be performed for each of the different sets of delay circuit delays that will be applied to determine transmission delays corresponding to the different sets of delay circuit delays. Accordingly, the memory controller 101 may determine a set of delays for the delay circuits D-1 to D-n during a write operation, and the memory controller may also apply the corresponding transmission delays (determined by data training).

During a write operation, the memory controller 101 may select a set of delays for the delay circuits D-1 to D-n based on a pattern of the parallel data bits to be transmitted to the IC memory device 103 over transmission lines DQ-1 to DQ-n during the write operation. This set of delays may be transmitted to the delay controller 111 and applied to the delay circuits D-1 to D-n before the data is transmitted over transmission lines DQ-1 to DQ-n. The pattern of data bits may then be transmitted from the memory controller 101 over transmission lines DQ-1 to DQ-n using respective phase delays previously determined using data training with the set of delays applied to the delay circuits D-1 to D-n.

According to still other embodiments of the present invention, each of the delay circuits D-1 to D-n may be a variable delay circuit including a delay bypass providing no delay. For example, a different bypass switch may be provided as a delay bypass for each delay circuit, and each bypass switch may be electrically coupled in parallel with the respective delay circuit between the clock signal iCK and the respective data input/output buffer I/O. During a data training operation, the memory controller 101 and/or the delay controller 111 may be configured to instruct the delay circuits D-1 to D-n to implement the delay bypass (e.g., closing the bypass switches to provide no delay). The memory controller 101 may thus perform data training with the delay circuits D-1 to D-n in a bypass mode to determine different transmission delays over the different transmission lines DQ-1 to DQ-n and/or misalignments of data relative to clock signals received at the different input/output buffers I/O-1 to I/O-n. The different transmission delays and/or misalignments relative to clock signals may then be corrected by implementing corrective delays at the respective delay circuits D-1 to D-n responsive to instructions provided by the memory controller 101 and/or the delay controller 111. During subsequent write operations, for example, parallel data bits may be transmitted from the memory controller 101 at the same time over transmission lines DQ-1 to DQ-n with the different delays enabled (e.g., by opening the respective bypass switches) at delay circuits D-1 to D-n to align the internal clock signal iCK with the data received at the respective input/output buffers I/O-1 to I/O-n.

The memory controller 101, for example, may be configured to determine differences in alignments of data communicated between the memory controller 101 and the plurality of data input/output buffers I/O-1 to I/O-n and to determine the delays for the plurality of variable delay circuits D-1 to D-n responsive to the differences in alignments. The determined delays for the plurality of variable delay circuits D-1 to D-n may then be transmitted to the delay controller 111 so that subsequent read/write operations are performed with the variable delay circuits D-1 to D-n providing the respective determined delays. By way of example, write data training may be used to determine transmission delays and/or data/clock misalignments, and delays of variable delay circuits D-1 to D-n may be set to correct the transmissions delays and/or data/clock misalignments (without adjusting phases of transmission from the memory controller). More particularly, the delay controller 111 may be configured to select delays to be provided by each of the variable delay circuits D-1 to D-n responsive to a Mode Register Set (MRS) instruction received from the memory controller 101 during an MRS operation.

While the present invention has been particularly shown and described with reference to embodiments thereof, it will be understood by those of ordinary skill in the art that various changes in form and details may be made therein without departing from the spirit and scope of the present invention as defined by the following claims.

That which is claimed is:

1. A memory system comprising:
an integrated circuit memory device including,
a memory cell array including a plurality of memory cells,
a clock generator configured to generate a clock signal,
a plurality of data input/output buffers coupled between respective data input/output pads and the memory cell array, wherein each of the data input/output buffers is configured to communicate data with the memory cell array responsive to the clock signal wherein the clock signal is applied to a clock input of each of the input/output buffers, and
a delay circuit coupled between the clock generator and a first one of the data input/output buffers so that the clock signal is delayed by different amounts at clock inputs of the first data input/output buffer and a second one of the data input/output buffers; and
a memory controller coupled to the integrated circuit memory device wherein the memory controller is configured to perform data training.

2. A memory system according to claim 1 wherein a difference in phase of the clock signal received at the first and second data input/output buffers is greater than 180 degrees.

3. A memory system according to claim 1 wherein the plurality of data input/output buffers comprise respective input buffers configured to write data received from the memory controller to the memory cell array responsive to the clock signals received at the clock inputs of the respective input/output buffers during write operations.

4. A memory system according to claim 3 wherein the plurality of input buffers is configured to receive a respective plurality of data bits in parallel during a same write operation responsive to a same edge of the clock signal.

5. A memory system according to claim 3 wherein the memory controller is configured to perform write data training to selectively delay data transmission to the input buffers so that reception of the data at the input buffers is aligned with the clock signals received at each input/output buffer during write operations.

6. A memory system according to claim 1 wherein the plurality of data input/output buffers comprises respective output buffers configured to transmit data read from the memory cell array to the memory controller responsive to the clock signals received at the clock inputs of the respective input/output buffers during read operations.

7. A memory system according to claim 6 wherein the plurality of output buffers are configured to transmit a respective plurality of data bits in parallel during a same read operation responsive to a same edge of the clock signal.

8. A memory system according to claim 6 wherein the memory controller is configured to perform read data training to selectively delay data reception at the memory controller from the input buffers.

9. A memory system according to claim 1 wherein the delay circuit comprises a variable delay circuit wherein the variable delay circuit is configured to provide one of a plurality of time delays for the clock signal responsive to an input signal provided thereto, wherein the integrated circuit memory device further includes a delay controller coupled to the variable delay circuit wherein the delay controller is configured to select a delay to be provided by the variable delay circuit.

10. A memory system according to claim 9 wherein the delay controller is configured to select a delay responsive to instructions received from the memory controller.

11. A memory system according to claim 9 wherein the delay controller is configured to select a delay responsive to a Mode Register Set (MRS) instruction received from the memory controller during a MRS operation.

12. A memory system according claim 1 wherein the delay circuit includes first and second delay circuits between the clock generator and the first and second data input/output buffers, respectively, so that the first and second delay circuits delay the clock signal by different amounts.

13. An integrated circuit memory device comprising:
a memory cell array including a plurality of memory cells;
a clock generator configured to generate a clock signal;
a plurality of data input/output buffers coupled between respective data input/output pads and the memory cell array, wherein each of the data input/output buffers is configured to communicate data with the memory cell array responsive to the clock signal wherein the clock signal is applied to a clock input of each of the input/output buffers; and a delay circuit coupled between the clock generator and a first one of the data input/output buffers so that the clock signal is delayed by different amounts at clock inputs of the first data input/output buffer and a second one of the data input/output buffers.

14. An integrated circuit memory device according to claim 13 wherein a difference in phase of the clock signal received at the first and second data input/output buffers is greater than 180 degrees.

15. An integrated circuit memory device according to claim 13 wherein the plurality of data input/output buffers comprise respective input buffers configured to write data received from a memory controller to the memory cell array responsive to the clock signals received at the clock inputs of the respective input/output buffers during write operations.

16. An integrated circuit memory device according to claim 15 wherein the plurality of input buffers is configured to receive a respective plurality of data bits in parallel during a same write operation responsive to a same edge of the clock signal.

17. An integrated circuit memory device according to claim 13 wherein the plurality of data input/output buffers comprises respective output buffers configured to transmit data read from the memory cell array to a memory controller responsive to the clock signals received at the clock inputs of the respective input/output buffers during read operations.

18. An integrated circuit memory device according to claim 17 wherein the plurality of output buffers are configured to transmit a respective plurality of data bits in parallel during a same read operation responsive to a same edge of the clock signal.

19. An integrated circuit memory device according to claim 13 wherein the delay circuit comprises a variable delay circuit wherein the variable delay circuit is configured to provide one of a plurality of time delays for the clock signal responsive to an input signal provided thereto, the integrated circuit memory device further comprising:

a delay controller coupled to-the variable delay circuit wherein the delay controller is configured to select a delay to be provided by the variable delay circuit.

20. An integrated circuit memory device according to claim 13 wherein the delay circuit includes first and second delay circuits between the clock generator and the first and second data input/output buffers, respectively, so that the first and second delay circuits delay the clock signal by different amounts.

* * * * *